(12) United States Patent
Rodrigues et al.

(10) Patent No.: US 9,539,672 B2
(45) Date of Patent: Jan. 10, 2017

(54) PORTABLE EQUIPMENT FOR MONITORING AND CONTROLLING THE LEVEL OF OXYGEN IN REFLOW OVEN ATMOSPHERE

(71) Applicant: L'Air Liquide, Société Anonyme pour l'Etude et l'Exploitation des Procédés Georges Claude, Paris (FR)

(72) Inventors: Luiz Rodrigues, Florianópolis (BR); Maicon Renan Neryz, Sao Paolo (BR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 14/651,836

(22) PCT Filed: Nov. 26, 2013

(86) PCT No.: PCT/EP2013/074744
§ 371 (c)(1),
(2) Date: Jun. 12, 2015

(87) PCT Pub. No.: WO2014/090571
PCT Pub. Date: Jun. 19, 2014

(65) Prior Publication Data
US 2015/0314401 A1 Nov. 5, 2015

(30) Foreign Application Priority Data
Dec. 14, 2012 (BR) .................. 102012032031 U

(51) Int. Cl.
*B23K 37/00* (2006.01)
*B23K 35/38* (2006.01)
(Continued)

(52) U.S. Cl.
CPC .......... *B23K 35/383* (2013.01); *B23K 1/0016* (2013.01); *B23K 1/012* (2013.01); *B23K 3/082* (2013.01);
(Continued)

(58) Field of Classification Search
None
See application file for complete search history.

(56) References Cited

U.S. PATENT DOCUMENTS 5,296,680 A * 3/1994 Yamada ................. B23K 1/008
219/388
5,341,978 A * 8/1994 Halstead ................ B23K 1/008
228/42

(Continued)

FOREIGN PATENT DOCUMENTS

CN 202411611 U * 9/2012
CN 103203509 A * 7/2013
(Continued)

OTHER PUBLICATIONS

International Search Report for corresponding PCT/EP2013/074744, Mar. 14, 2014.
Written Opinion for related PCT/EP2013/074744, Nov. 26, 2013.

*Primary Examiner* — Kiley Stoner
(74) *Attorney, Agent, or Firm* — Elwood L. Haynes

(57) ABSTRACT

The present invention describes a portable device for monitoring and controlling the level of residual oxygen in reflow oven atmosphere (1). This referred equipment is able to determine the quality of the atmosphere of a reflow oven, using parameters predetermined by the user. Therefore, the equipment performs the monitoring of the reflow oven atmosphere (1) controlling the level of residual oxygen of the reflow oven (1) by increasing or decreasing of the feed flow rate of nitrogen by the control that the microcontroller (Continued)

exerts over the proportional valve of nitrogen flow control (9), by opening or closing the valves to kept such predetermined values.

7 Claims, 1 Drawing Sheet

(51) Int. Cl.
    *H05K 3/34*     (2006.01)
    *B23K 3/08*     (2006.01)
    *B23K 1/00*     (2006.01)
    *B23K 1/012*     (2006.01)

(52) U.S. Cl.
    CPC ............. *B23K 35/38* (2013.01); *H05K 3/34* (2013.01); *H05K 3/3494* (2013.01); *H05K 2203/086* (2013.01); *H05K 2203/16* (2013.01); *H05K 2203/163* (2013.01)

(56) References Cited

U.S. PATENT DOCUMENTS

| | | | | |
|---|---|---|---|---|
| 5,356,066 A * | 10/1994 | Yamada | ............... | B23K 1/008 228/42 |
| 5,364,007 A * | 11/1994 | Jacobs | ............... | B23K 3/0646 219/390 |
| 6,409,070 B1 * | 6/2002 | Master | ............... | B23K 1/203 228/102 |
| 2001/0030184 A1 * | 10/2001 | Richert | ............ | H01L 21/67115 219/388 |
| 2002/0073574 A1 * | 6/2002 | Durdag | ............... | B23K 1/0016 34/201 |
| 2002/0130164 A1 * | 9/2002 | Matsuki | ............... | B23K 1/008 228/206 |
| 2003/0168499 A1 * | 9/2003 | Tanabe | ............... | B23K 1/085 228/260 |
| 2003/0213833 A1 * | 11/2003 | Nakamura | ............ | B23K 1/008 228/256 |
| 2003/0218058 A1 * | 11/2003 | Shaw | ............... | B23K 1/012 228/230 |
| 2007/0284417 A1 | 12/2007 | Yamada | | |
| 2009/0218386 A1 * | 9/2009 | Kimbara | ............ | B23K 1/0016 228/103 |
| 2009/0325116 A1 * | 12/2009 | Matsuura | ............ | B23K 1/0016 432/198 |
| 2010/0147327 A1 * | 6/2010 | Kondo | ............... | B08B 7/0042 134/1 |
| 2011/0017805 A1 | 1/2011 | Yanaros et al. | | |
| 2013/0175323 A1 * | 7/2013 | Zhang | ............... | B23K 1/0016 228/4.1 |
| 2013/0200136 A1 * | 8/2013 | Besshi | ............... | B23K 1/0016 228/219 |
| 2014/0290286 A1 * | 10/2014 | Liebert | ............... | B23K 1/0016 62/63 |
| 2015/0122876 A1 * | 5/2015 | Breingan | ............ | B23K 1/203 228/207 |
| 2015/0208515 A1 * | 7/2015 | Dautenhahn | .......... | H05K 3/306 228/6.2 |

FOREIGN PATENT DOCUMENTS

| | | | |
|---|---|---|---|
| DE | 10 2009 003023 | | 11/2010 |
| EP | 0 549 262 | | 6/1993 |
| JP | 06344176 | A * | 12/1994 |
| JP | 07170062 | A * | 7/1995 |
| JP | 08172263 | A * | 7/1996 |
| JP | 2011 143458 | | 7/2011 |
| JP | 2011245529 | A * | 12/2011 |
| KR | 101213641 | B1 * | 12/2012 |
| WO | WO 2007 069705 | | 6/2007 |

* cited by examiner

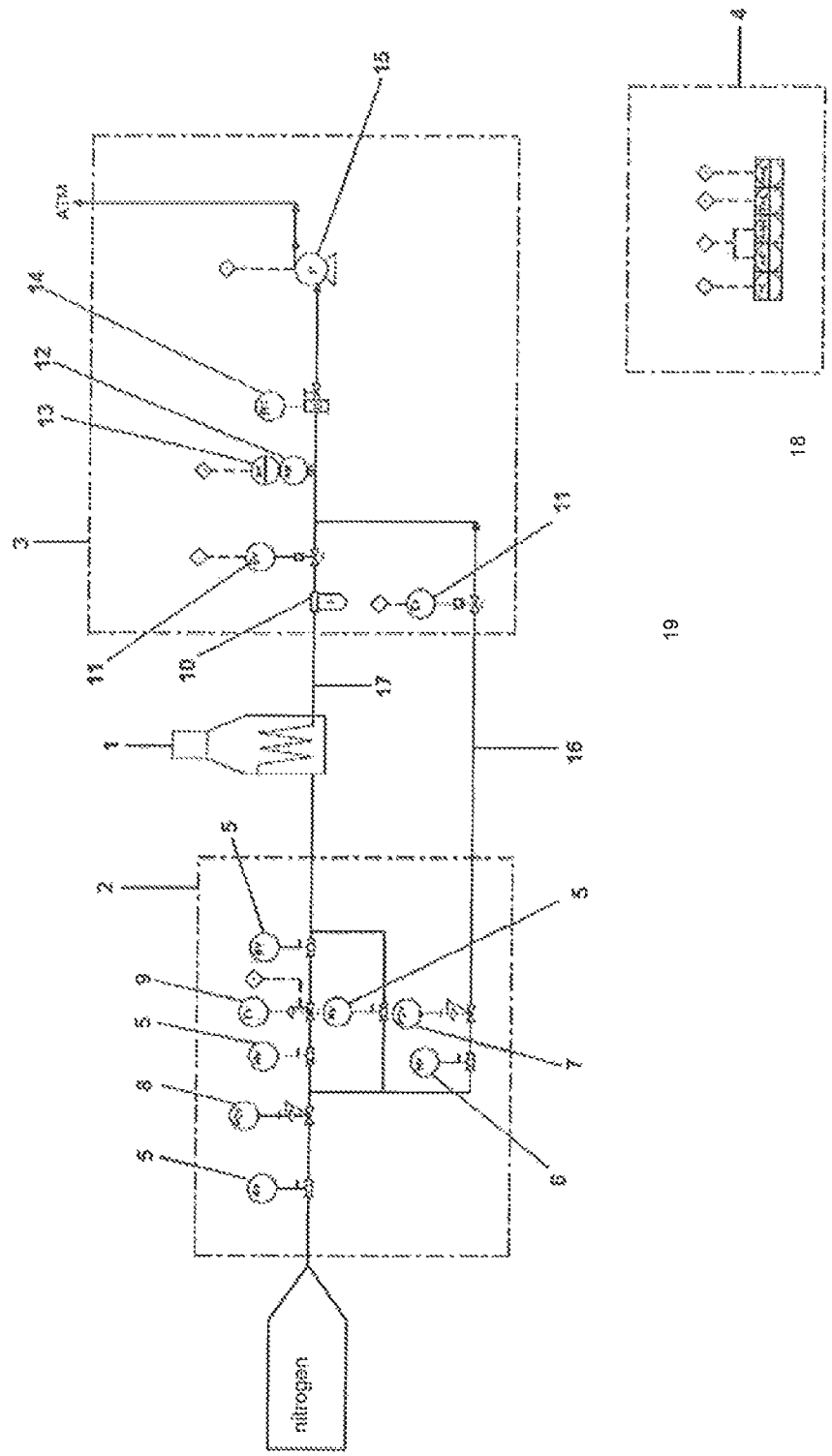

PORTABLE EQUIPMENT FOR MONITORING AND CONTROLLING THE LEVEL OF OXYGEN IN REFLOW OVEN ATMOSPHERE

CROSS REFERENCE TO RELATED APPLICATIONS

This application is a 371 of International PCT Application PCT/EP2013/074744 filed Nov. 26, 2013 which claims priority to Brazilian Patent Application No. 1020120320312 filed Dec. 14, 2012, the entire contents of which are incorporated herein by reference.

FIELD OF APPLICATION

The present invention belongs to the electronic engineering field for its reference to portable equipment for monitoring and controlling the level of oxygen in reflow ovens atmosphere.

STATE OF THE ART

A reflow oven is a heating device used for soldering electronic components on printed circuit boards, through the surface mount technology (SMT).

The use of this technique in the industry of electronics manufacturing enables an easier construction of electronic devices, ensuring that the electronic components are properly mounted and that the electrical connections on the circuit board are guaranteed by reflowed soldering techniques.

The technique of using an inert atmosphere is pretty much applied to control chemical reactions when handled substances present high sensitivity to air.

Several materials used in modern technologies such as microelectronics, among others, exhibit unusual and undesired states of oxidation and reactions due to the presence of atmospheric air.

As a solution to this problem, the use of inert gas in, for example, the atmosphere of reflow ovens, made it possible that even at high temperatures, the adverse effects of oxidation are reduced.

Some reflow ovens can operate with an atmosphere of inert gas, although they sometimes have some equipment for monitoring the air quality when related to oxygen levels, and they generally do not make it possible to adjust the quality of the oven atmosphere and it is an integral part of the own reflow oven. In these ovens, without the action of an operator in controlling the flow of nitrogen of this equipment, there may be some waste or lack of nitrogen in the atmosphere of the reflow oven. This lack generates high levels of oxygen in the welding surroundings which can cause welding defects such as open circuits, solder balls, short circuits, among others.

For example, the document JP20100007080 describes a reflow oven capable of controlling the supply of nitrogen and preventing the increase on the concentration of oxygen coming from the outside air. The atmosphere control system is an integral part of the oven, and therefore, it is not a portable device.

The present invention describes a portable equipment for monitoring and controlling the level of oxygen in the atmosphere of reflow ovens, which is portable as its main advantage, and that it can be easily coupled to any conventional reflow ovens using their own outputs of nitrogen and of existing sampling in all reflow ovens, for the connection of collecting and analysis boxes and control of nitrogen injection flow. Therefore, its maintenance is made easier.

The system allows the user to predetermine the desired level of oxygen in the reflow ovens surroundings; it keeps the oxygen levels desired by the user without the need for an operator to control the flow/volume of nitrogen injections in the reflow oven; prevents spending insufficient or excessive nitrogen in reflow ovens processes, and improving the quality of the final product.

BRIEF DESCRIPTION OF THE INVENTION

The present invention describes the portable equipment for monitoring and controlling the level of oxygen in atmosphere of reflow ovens.

The device features interface in which the user can preselect the desired values for a given operation.

The referred equipment is able to determine the quality of the atmosphere of a reflow oven through parameters predetermined by the user. Therefore, the equipment performs the monitoring of the atmosphere of the reflow oven and controls the oxygen level in the reflow oven by increasing or decreasing the influx of nitrogen through the control that the microcontroller has on the control valve of nitrogen injection, by opening or closing the proportional valve of nitrogen flow control, in order to maintain those predetermined values of oxygen concentration.

BRIEF DESCRIPTION OF THE DRAWINGS

FIG. 1 is a schematic flow diagram of the portable equipment for monitoring and controlling the atmosphere of reflow ovens.

DETAILED DESCRIPTION OF THE INVENTION

This invention describes the portable equipment for monitoring and controlling the atmosphere of reflow ovens (1).

The referred equipment is capable of: instantly ascertain the quality of the atmosphere of a reflow oven (1), to perform its monitoring and control.

According to FIG. 1, the portable equipment for monitoring and controlling the atmosphere of reflow ovens (1) has: a collection and analysis box (3), a control box of nitrogen injection flow (2), a box with programmable controller, electrical power and display with communicative interface (4), connected with one another by electrical cables of power and logic.

The control box of nitrogen injection flow (2) is comprised of ball-type manual valves (5), nitrogen pressure regulators with pressure gauge (8), proportional valve of nitrogen flow control (9) located between the nitrogen network and the reflow oven (1).

There is a cleaning line (16) that comes out of the box control of nitrogen injection flow (2) which can be used to clean the sampling system using nitrogen. The cleaning line (16) is comprised of a ball-type manual valve of the cleaning line (6) and nitrogen pressure regulator of the cleaning line with pressure gauge (7).

The collecting and analysis box (3) is comprised of line filter (10), solenoid valves (11) to control the input of cleaning sample or nitrogen, a lambda sensor coupled to an analysis chamber (12) which sends electrical signal to the signal converter (13), flow meter with needle valve (14) and a diaphragm-type vacuum pump (15).

The box with the programmable controller, electrical power and display with communicative interface (4) is comprised of a microcontroller and an electrical panel of the control system.

Operation of Portable Equipment for Monitoring and Controlling the Level of Oxygen in Reflow Oven Atmosphere The portable equipment for monitoring and controlling the atmosphere of reflow ovens (1) can be coupled to reflow ovens (1) of any brand and model for monitoring/controlling the reflow atmosphere.

In the existing communicative interface in the box with programmable controller (4), the user preselects the desired values of oxygen on the reflow surroundings for a given recipe for the oven operation.

Firstly, the equipment evaluates the values if the oxygen amount collected in the sampling collecting and analysis box (3) corresponds to an atmosphere within the desired operating recipe, as predetermined by the user.

The microcontroller performs the control of the oxygen level in the reflow oven (1) by using as an ideal parameter the value preselected by the user. Additionally, the microcontroller informs the oxygen value measured through the equipment display and controls the nitrogen injection flow so that the oxygen level is kept in the reflow surroundings, according to that preselected by the user.

The microcontroller continuously compares the oxygen levels desired predetermined by the oven operator (1) (set point) to real values presented during the operation performed at that time. The information on quality of the reflow atmosphere is obtained by the lambda sensor (12) in the collecting and analysis box (3) connected to the sampling line (17) of the reflow oven (1).

After that comparison performed between the real values at the time of oven operation (1) and the values preset by the user, a command signal is sent from the microcontroller to the nitrogen flow control box (2), which then coordinates if the proportional valve of nitrogen flow control (9) must be open or closed. Therefore, it is possible to control the desired amount of oxygen in the reflow atmosphere.

This system was designed to control oxygen concentrations below 3000 PPM, in the reflow oven surroundings (1). This way, during the monitoring the equipment detects that there is too much oxygen in the reflow oven surroundings (1) (levels above those previously determined by the user), the equipment automatically injects more nitrogen to the reflow oven (1) until the level predetermined by the user is reached.

On the other hand, when the level of residual oxygen in the reflow surroundings is extremely low (below those values predetermined by the user), the equipment automatically reduces the nitrogen flow into the reflow oven (1), by closing the proportional valve of nitrogen flow control. (9).

When the oxygen level is according to what has previously been predetermined by the user, the equipment automatically locks the open position of the proportional valve of nitrogen flow control (9). This way, it is kept a constant nitrogen injection flow into the reflow oven (1) until the moment at which the equipment detects that the oxygen level is no longer as predetermined by the user.

Therefore, the use of a nitrogen amount lower or higher than that required for that oven specific operation (1) is avoided, preventing the waste of nitrogen, improving the quality of the final product of which specification requires low oxygen concentration in the reflow surroundings.

Although the invention has been extensively described, it is obvious to those skilled in the art that several changes and modifications can be made aiming at a design improvement without these changes being not covered by the scope of the invention.

The invention claimed is:

1. Portable equipment for monitoring and controlling the atmosphere of reflow ovens, comprising:
    a nitrogen injection flow control box comprising at least one ball-type manual valve, at least one nitrogen pressure regulator with pressure gauge, a proportional valve of nitrogen flow control; and a cleaning line comprising a ball-type manual valve of the cleaning line and nitrogen pressure regulator of the cleaning line with a manometer;
    a collecting and analysis box comprising a line filter, at least one solenoid valve, a lambda sensor coupled with an analysis chamber, a signal converter, a flow meter with needle valve, and a diaphragm-type vacuum pump; and
    a box with a programmable controller, and a display with communicative interface comprising of a microcontroller, and a signal converter the lambda sensor coupled with an analysis chamber connected with one to another by electrical cables.

2. The portable equipment according to claim 1, wherein the cleaning line is used for cleaning a sampling system utilizing nitrogen.

3. The portable equipment according to claim 1, wherein the solenoid valve controls the flow rate of a cleaning sample or nitrogen.

4. The portable equipment, according to claim 1, wherein a desired value of oxygen in the reflow surroundings is preselected through a communicative interface.

5. The portable equipment, according to claim 1, wherein the lambda sensor coupled to an analysis chamber sends electrical signal to the signal converter.

6. The portable equipment, according to claim 1, wherein the microcontroller uninterruptedly evaluates and controls oxygen values collected in the collecting and analysis box of samples and makes a comparison with values of the atmosphere predetermined by a user.

7. The portable equipment, according to claim 1, wherein the microcontroller sends a control signal to the control box of nitrogen flow that coordinates opening and closing of the proportional valve of nitrogen flow control.

* * * * *